United States Patent
Wakaki

(10) Patent No.: US 11,309,847 B2
(45) Date of Patent: Apr. 19, 2022

(54) AMPLIFIER CIRCUIT

(71) Applicant: Murata Manufacturing Co., Ltd., Kyoto (JP)

(72) Inventor: Ken Wakaki, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/006,020

(22) Filed: Aug. 28, 2020

(65) Prior Publication Data
US 2021/0067103 A1 Mar. 4, 2021

(30) Foreign Application Priority Data
Aug. 29, 2019 (JP) ............... JP2019-157002

(51) Int. Cl.
*H03F 1/14* (2006.01)
*H03F 1/32* (2006.01)
*H03F 3/16* (2006.01)
*H03F 1/56* (2006.01)
*H03F 3/72* (2006.01)
*H03F 1/02* (2006.01)

(52) U.S. Cl.
CPC ............. *H03F 1/3205* (2013.01); *H03F 3/16* (2013.01); *H03F 1/0205* (2013.01); *H03F 1/565* (2013.01); *H03F 3/72* (2013.01); *H03F 2200/387* (2013.01)

(58) Field of Classification Search
CPC .......... H03F 1/3205; H03F 3/16; H03F 1/565; H03F 2200/387; H03F 2203/7239; H03F 2203/7236; H03F 3/72; H03F 3/19; H03F 3/45475; H03F 1/303; H03F 3/005; H03F 1/0277; H03G 1/0088
USPC ................................ 330/9, 51, 277
See application file for complete search history.

(56) References Cited

U.S. PATENT DOCUMENTS

| | | | |
|---|---|---|---|
| 8,149,049 B2* | 4/2012 | Takeuchi ............ | H03G 1/0088 330/51 |
| 9,337,775 B1* | 5/2016 | Ilkov ..................... | H03F 1/0261 |
| 9,479,126 B2* | 10/2016 | Ilkov ..................... | H03F 1/565 |
| 10,432,238 B1* | 10/2019 | Luo ........................ | H04B 1/006 |
| 11,075,661 B1* | 7/2021 | Jiang ...................... | H03F 3/245 |
| 2018/0248526 A1 | 8/2018 | Lee et al. | |
| 2019/0386618 A1* | 12/2019 | Watanabe ................ | H03F 3/21 |

* cited by examiner

*Primary Examiner* — Khanh V Nguyen
(74) *Attorney, Agent, or Firm* — Pearne & Gordon LLP

(57) ABSTRACT

An amplifier circuit has an amplification path including an amplifier and a bypass path configured to bypass at least the amplifier. The bypass path includes a switch coupled in series on the bypass path and another switch coupled in series between the bypass path and ground. The amplification path further includes an inductor coupled on an output side with respect to the amplifier and a switch coupled between the inductor and ground on a path between the inductor and the amplifier.

13 Claims, 4 Drawing Sheets

AMPLIFIER CIRCUIT

This application claims priority from Japanese Patent Application No. 2019-157002 filed on Aug. 29, 2019. The content of this application is incorporated herein by reference in its entirety.

BACKGROUND OF THE DISCLOSURE

Field of the Disclosure

The present disclosure relates to amplifier circuits, and more particularly, an amplifier circuit having an amplification path and a bypass path.

Description of the Related Art

An amplifier circuit having an amplification path including an amplifier and a bypass path configured to bypass at least the amplifier is known (for example, FIG. 5D in U.S. Patent Application Publication No. 2018-0248526). In the amplifier circuit, a bypass switch that switches between communicating or not communicating a bypass signal and a shunt switch coupled between the bypass path and ground are provided on the bypass path. In this amplifier circuit, including the shunt switch improves the isolation characteristic of the bypass path.

BRIEF SUMMARY OF THE DISCLOSURE

The amplifier circuit described above has a configuration in which non-linear distortion including harmonic distortion and intermodulation distortion due to non-linear performance of the amplifier is easily generated.

In a bypass mode in which a signal is routed along the bypass path, the bypass switch is in an on-state and the shunt switch is in an off-state. In this case, an off-capacitance occurs at the shunt switch and the off-capacitance is shunt-connected to the bypass path, and as a result, impedance matching at an output node of the amplifier circuit may become worse.

In an amplification mode in which a signal is amplified through an amplification path, the bypass switch is in an off-state and the shunt switch is in an on-state in the bypass path. In this case, an off-capacitance occurs at the bypass switch and the off-capacitance is shunt-connected to the bypass path, and as a result, impedance matching at an output node of the amplifier circuit may become worse.

If impedance matching at an output node of the amplifier circuit deteriorates in both the bypass and amplification modes, the gain and the distortion characteristic of the amplifier circuit may be degraded.

Accordingly, it is an object of the present disclosure to provide an amplifier circuit having an amplification path including an amplifier and a bypass path configured to bypass at least the amplifier, the amplifier circuit being capable of improving output impedance matching in both bypass and amplification modes and reducing non-linear distortion.

To achieve the object described above, an amplifier circuit according to an aspect of the present disclosure includes an amplification path including an amplifier and a bypass path configured to bypass at least the amplifier. The bypass path includes a first series switch coupled in series on the bypass path and a first shunt switch coupled in series between the bypass path and ground. The amplification path includes an inductor coupled on an output side with respect to the amplifier and a second shunt switch coupled between the inductor and ground on a path between the inductor and the amplifier.

In the configuration described above, the inductor and the second shunt switch coupled in series between the inductor and ground are provided on the output side with respect to the amplifier. Since the inductor is provided on the output side with respect to the amplifier, high frequency signal components outputted by the amplifier are reduced, and as a result, distortion due to non-linear performance of the amplifier is reduced.

Moreover, it is possible to improve output impedance matching in both bypass and amplification modes.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
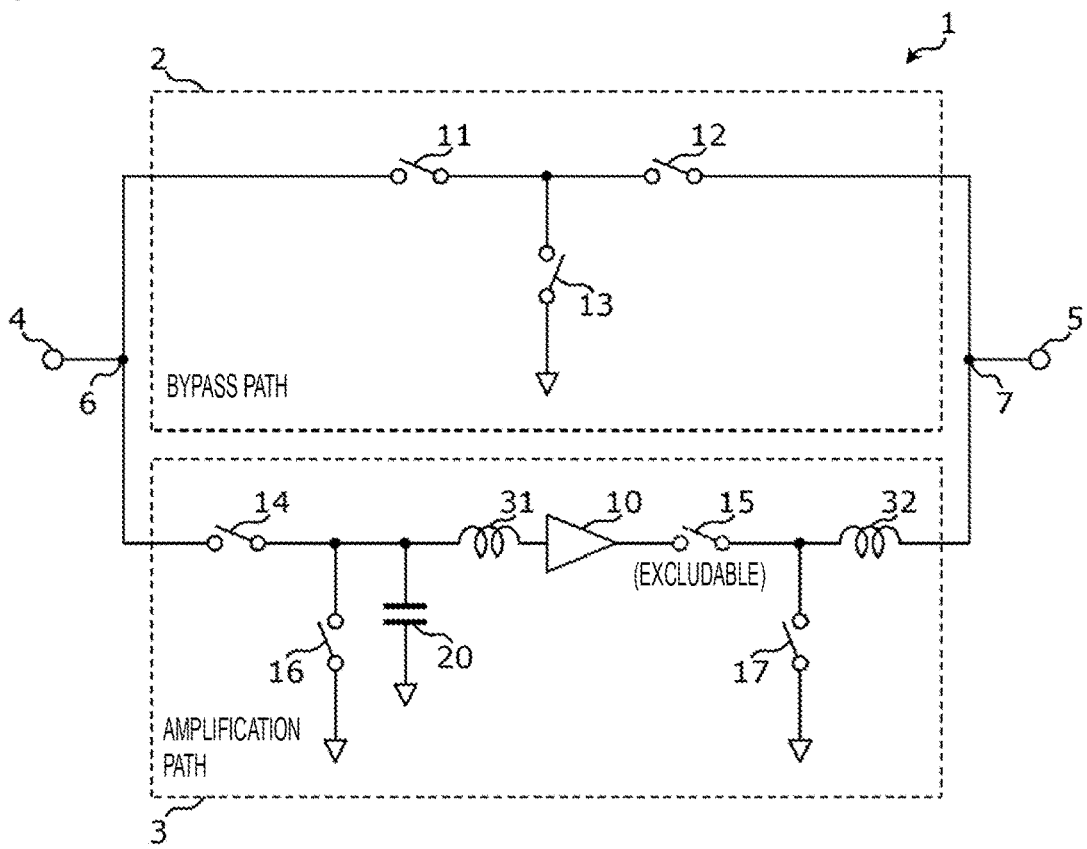
FIG. 1 is a circuit diagram illustrating an example of a configuration of an amplifier circuit according to an embodiment.

An amplifier circuit according to preferred embodiments of the present disclosure is described in detail with reference to the accompanying drawings. It should be noted that the preferred embodiments described below are all specific or comprehensive instances. The numerical values, the shapes, the materials, the constituent elements, the arrangements of the constituent elements, and the modes of connection, and the like given in the following embodiments are mere instances and are not intended to limit the present disclosure.

In the following description, matters relating to only operation and matching regarding high frequencies that indicate characteristics of an amplifier circuit are mainly illustrated in the drawings and explained. For example, illustrations and descriptions of a bias circuit and a control circuit are basically omitted.

The term "couple" denotes that two or more objects or parts of objects are coupled to each other directly or by using one or more components, circuit elements, or connection materials such as solders.

The term "shunt" denotes a connection mode in which an object is coupled between a signal path connecting the input and output of a circuit to each other and ground.

The term "inductor" denotes an electrical element in which the inductance, that is, the positive reactance component at desired frequencies has a main role.

Examples of an inductor include a coil inductor formed in an annular shape by winding a linear conductor once or more and inductors formed of linear, curved, and bended conductors. The inductor may be a line conductor of an electrical length equal to or less than a ¼ wave length. In the case in which the amplifier circuit is formed as an integrated circuit (IC), a spiral inductor may be used.

The term "capacitor" denotes an electrical element in which the capacitance, that is, the negative reactance component at desired frequencies has a main role.

Examples of a capacitor include a capacitor formed on a plane of a dielectric including air or formed between electrodes facing each other with a dielectric interposed therebetween. As a shunt capacitor, a line open stub of an electrical length equal to or less than a ¼ wave length may be used. In the case in which the amplifier circuit is formed as an IC, a metal-oxide-metal (MOM) capacitor or a metal-insulator-metal (MIM) capacitor may be used.

Embodiment

An amplifier circuit according to an embodiment is described by using an example of an amplifier circuit having an amplification path including an amplifier and a bypass path configured to bypass at least the amplifier.

FIG. 1 is a circuit diagram illustrating an example of a configuration of the amplifier circuit according to the embodiment. As illustrated in FIG. 1, in an amplifier circuit 1, a bypass path 2 and an amplification path 3 including an amplifier 10 are coupled in parallel with each other between nodes 6 and 7. The nodes 6 and 7 are coupled respectively to an input end 4 and an output end 5. In other words, the node 6 is an input node, and the node 7 is an output node. The amplifier 10 is configured to include, for example, a transistor. In particular, when a field effect transistor is used as the transistor, it is possible to effectively use off-capacitance of the transistor as described later.

The bypass path 2 includes switches 11, 12, and 13. The switch 12 is coupled in series on the bypass path 2. The switch 13 is coupled in series between the bypass path 2 and ground. In other words, the switch 13 is connected to ground in parallel between the input node and the output node. The switch 11 is coupled in series on the bypass path 2 at a position opposite to the switch 12 with respect to the switch 13.

Here, one of the switches 11 and 12 is an example of a first series switch; the switch 13 is an example of a first shunt switch; and the other of the switches 11 and 12 is an example of a third series switch. For the switches 11 and 12, capacitors, which are not illustrated in the drawing, may be provided as needed. Any one of the switches 11 and 12 may not be included.

The amplification path 3 includes the amplifier 10 as described above and further includes an inductor 32, and switches 17 and 15. The inductor 32 is coupled on an output side with respect to the amplifier 10; one end (first end) is coupled to the amplifier 10, and the switches 15 and 17; the other end (second end) is coupled to the output end 5. Specifically, the inductor 32 is connected in series between the amplifier 10 and the node 7. The switch 17 is coupled between ground and the first end of the inductor 32 which is opposite to the second end of the inductor 32 at the output node 7 side of the inductor 32. The first end of the inductor 32 is closer to the switch 17 and ground than the second end of the inductor 32. The first end of the inductor 32 is also disposed on the ground side among the ground side of the inductor 32 and the node 7 side of the inductor 32, and the second end of the inductor 32 is also disposed on the node 7 side of the inductor 32 among the ground side of the inductor 32 and the node 7 side of the inductor. Specifically, the switch 17 is coupled between the inductor 32 and ground on a path between the inductor 32 and the amplifier 10. The switch 15 is coupled between the amplifier 10 and the switch 17. Specifically, one end of the switch 15 is coupled to an output side with respect to the amplifier 10 and the other end of the switch 15 is coupled to the switch 17 and the inductor 32.

Here, the switch 17 is an example of a second shunt switch and the switch 15 is an example of a second series switch. Here, a capacitor, which is not illustrated in the drawing, may be provided in parallel with the switch 17 as needed. The switch 15 may not be included.

The amplification path 3 further includes an inductor 31, a capacitor 20, and switches 14 and 16 on an input side with respect to the amplifier 10. One end of the inductor 31 is coupled to an input end of the amplifier 10. The other end of the inductor 31 is coupled to one end of the capacitor 20, one end of the switch 16, and one end of the switch 14. The other end of the switch 14 is coupled to the input end 4. The other end of the capacitor 20 and the other end of the switch 16 are grounded; in other words, the capacitor 20 and the switch 16 are coupled between the inductor 31 and ground on a path between the inductor 31 and the switch 14. The switches 14 and 16, the capacitor 20, and the inductor 31 may not be included.

The switches 11 to 17 are single-pole single-throw switches; the switches 11 to 17 are configured as, for example, a single transistor or a transistor stack in which a plurality of transistors are coupled in series with each other. In particular, when a field effect transistor is used as the transistor, it is possible to effectively use off-capacitance of the transistor as described later.

In the amplifier circuit 1, the inductor 32 is provided on the output side with respect to the amplifier 10. This reduces high frequency signal components outputted by the amplifier 10, and as a result, distortion due to non-linear performance of the amplifier 10 is reduced.

Next, effects of improving output matching in the amplifier circuit 1 in a bypass mode and an amplification mode are described.

Figure 2:
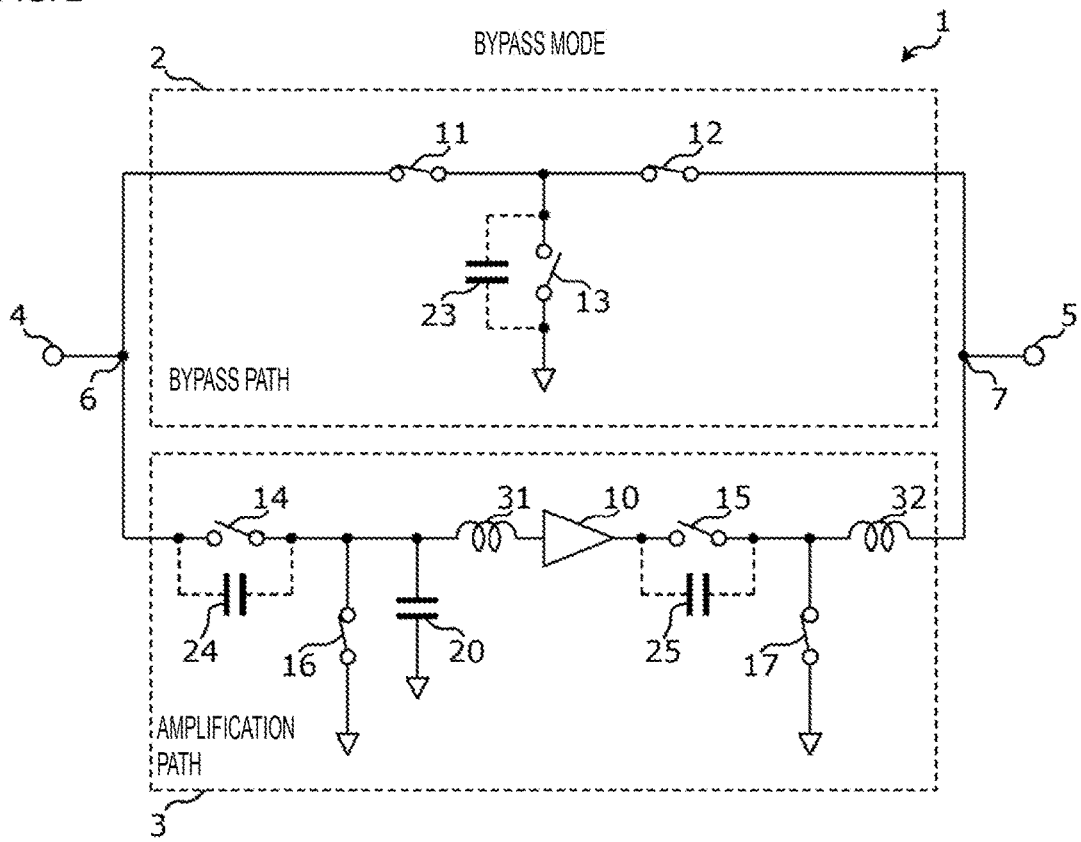
FIG. 2 is a circuit diagram for explaining an operation of the amplifier circuit according to the embodiment in a bypass mode.

FIG. 2 is a circuit diagram for explaining an operation of the amplifier circuit 1 in a bypass mode. The bypass mode denotes an operation mode of the amplifier circuit 1 in which the bypass path 2 is in a connected state, a bias power supply for the amplifier 10 is turned off, and the amplification path 3 does not perform an amplification operation.

In the bypass mode, among the switches provided in the bypass path 2, the switches 11 and 12 are in an on-state and the switch 13 is in an off-state. Among the switches provided in the amplification path 3, the switches 14 and 15 are in an off-state and the switches 16 and 17 are in an on-state. Since the switches 16 and 17 are in an on-state, the isolation characteristic between the bypass path 2 and the amplification path 3 in the bypass mode becomes better.

The switch 14 is in an off-state in the bypass mode and equivalently functions as an off-capacitance 24. One end of the off-capacitance 24 is coupled to the input end 4 and the other end is grounded via the switch 16 in an on-state.

Accordingly, the off-capacitance 24 operates as a shunt capacitor coupled to the input end 4. Similarly, the switch 13 equivalently functions as an off-capacitance 23 and operates as a shunt capacitor coupled to the input end 4 and the output end 5.

One end of the inductor 32 is coupled to the output end 5 and the other end is grounded via the switch 17 in an on-state. Accordingly, the inductor 32 operates as a shunt inductor coupled to the output end 5.

Figure 3:
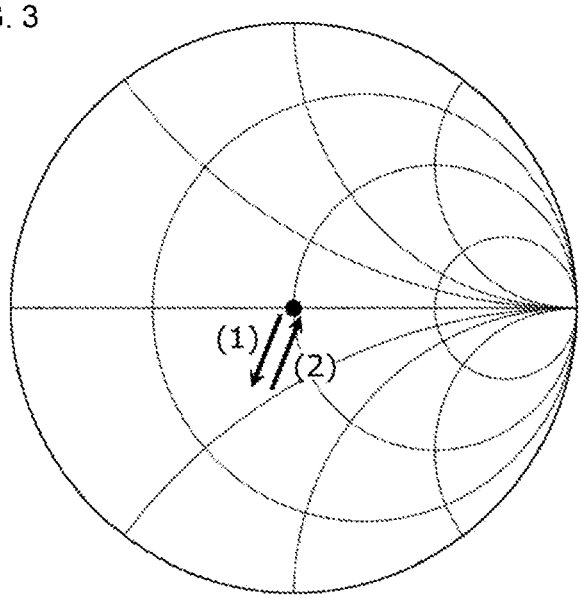
FIG. 3 is a chart for explaining output matching in the amplifier circuit according to the embodiment in the bypass mode.

FIG. 3 is a chart for explaining output matching in the amplifier circuit 1 in the bypass mode. In FIG. 3, the behavior of impedance matching in the amplifier circuit 1 as viewed from the output end 5, that is, output matching in the amplifier circuit 1 is described by using a Smith chart.

The shunt capacitors implemented by shunt capacitances of the off-capacitance 23 of the switch 13 and the off-capacitance 24 of the switch 14, that is, negative reactance is coupled to the bypass path 2. As a result, matching deviation occurs in the negative reactance direction ((1) in FIG. 3). At the same time, since the switch 17 is in an on-state, the inductor 32 with positive reactance is shunt-connected to the bypass path 2. The reactance components cancel each other out when positive and negative reactance values are properly determined in the design, and as a result, a matching state, that is, the state in which the reactance component in the amplifier circuit 1 as viewed from the output end 5 is 0Ω or the state in which the reactance component is approximately 0Ω is achieved ((2) in FIG. 3).

In this case, the inductor 32 is also used for output matching in the amplification mode described later and no additional component except the switch 17 is necessary, which is advantageous in downsizing the amplifier circuit 1. Furthermore, in the amplification mode, it is possible to reduce a capacitance value for output matching or remove a capacitor for output matching equivalently to an off-capacitance 27 of the switch 17, which is also advantageous in downsizing the amplifier circuit 1.

As such, the amplifier circuit 1 can achieve favorable output matching in the bypass mode, and thus, it is possible to decrease insertion loss in the bypass mode.

Moreover, since the switch 15 is provided, the amplifier 10 is hidden in the bypass mode by the use of the switch 15 in an off-state, and as a result, it is possible to reduce effects of the amplifier 10 on the bypass path 2.

In the case in which the on-resistance of the switch 17 is relatively high, when the switch 17 is in an on-state, it may cause undesirable phenomena such as resonance of the output capacitance of the amplifier 10 and the inductor 32 and interference of an additional element to the amplifier 10 such as a regeneration inductor and the inductor 32. In this regard, the switch 15 is provided to hide the amplifier 10 by switching off the switch 15, so that adverse effects and interference are eliminated; and as a result, it is possible to achieve the operation expected in the bypass mode in a more desirable manner.

If the switch 15 is coupled between the switch 17 and the inductor 32 or between the inductor 32 and the output end 5, it is difficult to form a shunt inductor by using the inductor 32 and the switch 17. Hence, it is preferable that the switch 15 is provided between the amplifier 10 and the switch 17 on the output side with respect to the amplifier 10 as illustrated in FIGS. 1 and 2.

In the case in which the electrical length of the bypass path 2 is sufficiently short, for example, in the case in which the electrical length of the bypass path 2 is equal to or shorter than 1/10 of the wave length of a high frequency signal transmitted in the amplifier circuit 1, it is possible to simply and favorably achieve the improvement of matching state described above in such a particular case. An example of such a case is the case of implementing the amplifier circuit 1 as an IC on a semiconductor chip.

Figure 4:
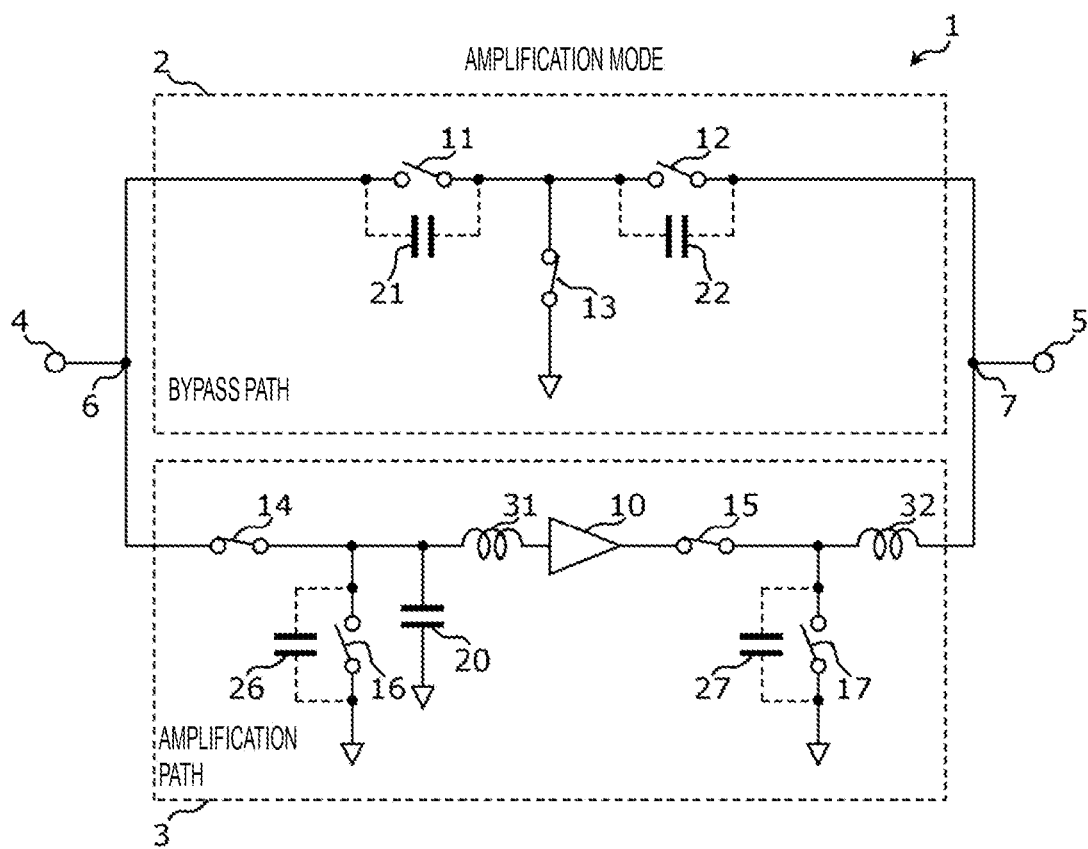
FIG. 4 is a circuit diagram for explaining an operation of the amplifier circuit according to the embodiment in an amplification mode.

FIG. 4 is a circuit diagram for explaining an operation of the amplifier circuit 1 in the amplification mode. The amplification mode denotes an operation mode of the amplifier circuit 1 in which the bypass path 2 is in a disconnected state, a bias power supply is supplied to the amplifier 10, and the amplification path 3 performs an amplification operation.

In the amplification mode, among the switches provided in the bypass path 2, the switches 11 and 12 are in an off-state and the switch 13 is in an on-state. Among the switches provided in the amplification path 3, the switches 14 and 15 are in an on-state and the switches 16 and 17 are in an off-state. Since the switch 13 is in an on-state, the isolation characteristic between the bypass path 2 and the amplification path 3 in the amplification mode becomes better.

The switch 16 is in an off-state in the amplification mode. The switch 16 in an off-state equivalently functions as an off-capacitance 26.

The switch 14 is in an on-state in the amplification mode.

The switch 17 is in an off-state in the amplification mode. The switch 17 in an off-state equivalently functions as the off-capacitance 27.

Figure 5:
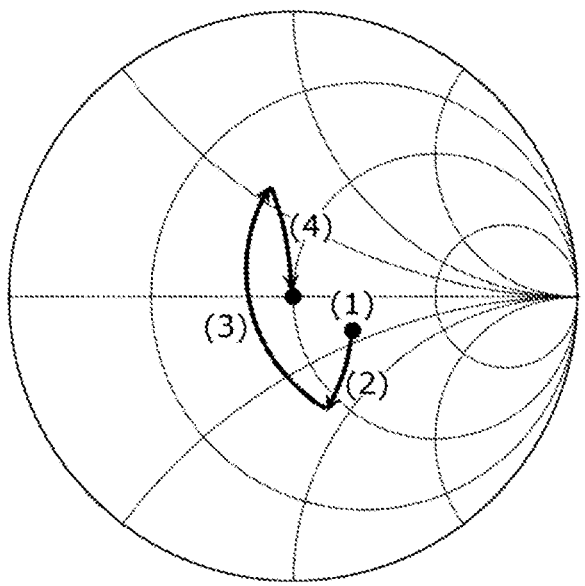
FIG. 5 is a chart for explaining output matching in the amplifier circuit according to the embodiment in the amplification mode.

FIG. 5 is a chart for explaining output matching in the amplifier circuit 1 in the amplification mode. In FIG. 5, the behavior of impedance matching in the amplifier circuit 1 as viewed from the output end 5, that is, output matching in the amplifier circuit 1 is described by using a Smith chart.

In the case in which the amplifier 10 is constituted by a metal-oxide-semiconductor field-effect transistor (MOSFET), the impedance at the output end of the amplifier 10 is determined in accordance with characteristics of the MOSFET included in the amplifier 10, and, for example, the impedance is positioned in the negative reactance region ((1) in FIG. 5).

By using the off-capacitance 27 of the switch 17 and, if needed, a capacitor for matching adjustment coupled in parallel with the switch 17, the impedance at the output end of the amplifier 10 is rotated clockwise in a negative reactance direction and shifted to the negative reactance region ((2) in FIG. 5).

Next, by using the inductor 32, the impedance at a node connecting the off-capacitance 27 and the output end of the amplifier 10 is rotated clockwise in a positive reactance direction and shifted to the positive reactance region ((3) in FIG. 5).

Next, by using the off-capacitance 22 of the switch 12 and, if needed, a capacitor for matching adjustment coupled in parallel with the switch 12, the impedance as the amplification path 3 is viewed from a node 7 is rotated clockwise in the negative reactance direction, and, for example, it is possible to position the impedance at the center of the Smith chart, which indicates 50Ω ((4) in FIG. 5).

In the impedance matching described above, the inductor 32 has a function of cancelling out the negative reactance coupled to the bypass path 2. Specifically, the off-capacitance 21 of the switch 11 and the off-capacitance 22 of the switch 12 are coupled to the bypass path 2 via the switch 13, such that the shunt capacitors, that is, the negative reactance is coupled to the bypass path 2. With this configuration, the impedance as the amplification path 3 is viewed from the node 7 is moved in the negative reactance direction as indicated by (4) in FIG. 5; however, as indicated by (3) in FIG. 5, since the impedance is previously moved to the positive reactance region by using the inductor 32, it is possible to cancel the negative reactance coupled to the bypass path 2.

As described above, the off-capacitance 27 of the switch 17 provided on the amplification path 3 can be used as a shunt capacitance component. Equivalently to the shunt capacitance component, it is possible to remove a capacitor for matching adjustment coupled in parallel with the switch 17 or reduce the capacitance value, which leads to downsizing the amplifier circuit 1. Specifically, in the case in which the off-capacitance 27 of the switch 17 is configured by the appropriate design of the switch 17 to have a capacitance value substantially equal to a capacitance value necessary for matching adjustment, it is possible to remove the capacitor for matching adjustment coupled in parallel with the switch 17. In the case in which the off-capacitance 27 of the switch 17 is configured to have a capacitance value lower than the capacitance value necessary for matching adjustment, a shunt capacitor (not illustrated in the drawing) of an appropriate capacitance value is coupled in parallel with the off-capacitance 27 of the switch 17.

While an example of a configuration and effects of the amplifier circuit 1 has been described above, the example used as the amplifier circuit 1 does not limit configurations that can achieve the effects described above.

Figure 6A:
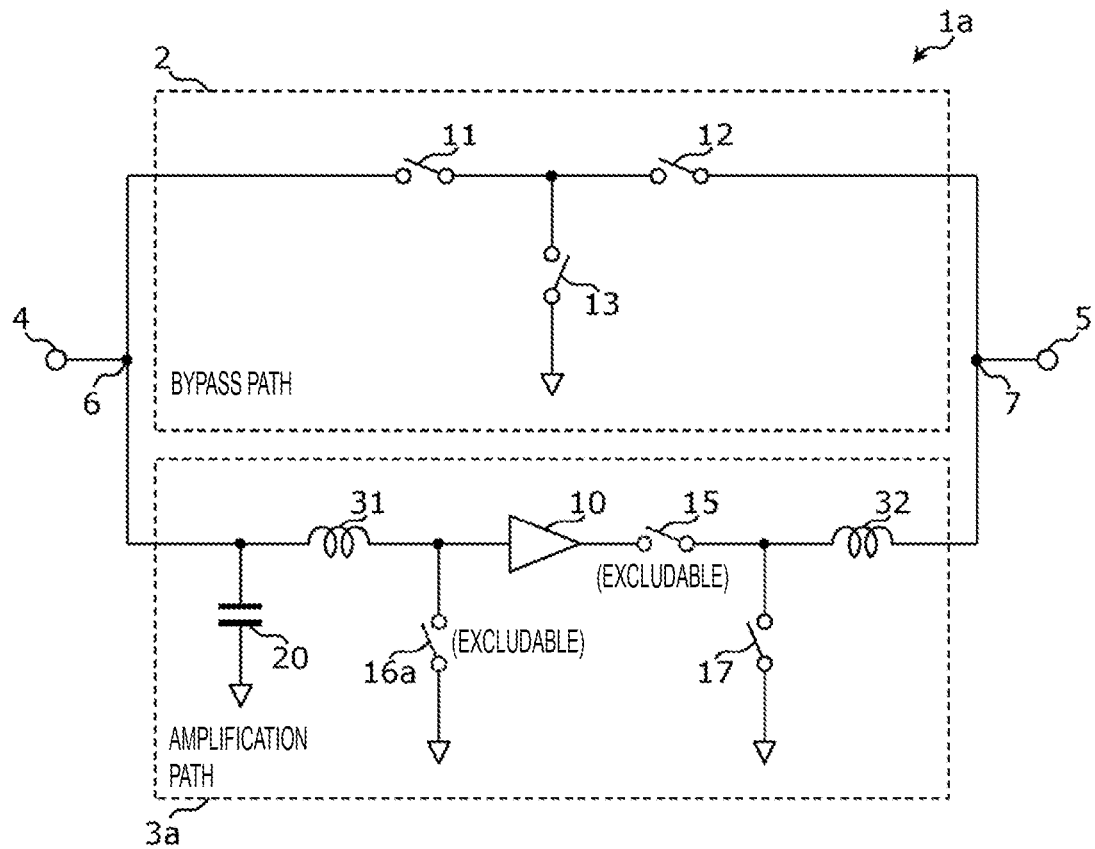
FIG. 6A is a circuit diagram illustrating another example of a configuration of the amplifier circuit according to the embodiment.

FIG. 6A is a circuit diagram illustrating another example of a configuration of the amplifier circuit according to the embodiment.

An amplifier circuit 1a illustrated in FIG. 6A differs from the amplifier circuit 1 in FIG. 1 in the configuration of an amplification path 3a on the input side with respect to the amplifier 10. Specifically, on the amplification path 3a, the switch 16a is coupled between the inductor 31 and ground on a path between the inductor 31 and the amplifier 10. The switch 14 is removed.

Since the switch 14 is removed from the amplifier circuit 1a, the amplification path 3a establishes connection with the input end 4 also in the bypass mode; however, a bias power supply for the amplifier 10 is turned off and the amplification path 3a accordingly does not perform an amplification operation, and as a result, no significant effect appears in the circuit operation.

In the amplifier circuit 1a, the configuration of the bypass path 2 and the configuration of the amplification path 3 on the output side with respect to the amplifier 10 are identical to those in the amplifier circuit 1. As a result, the amplifier circuit 1a also can achieve the same effects as the effects described above with regard to the amplifier circuit 1.

Figure 6B:
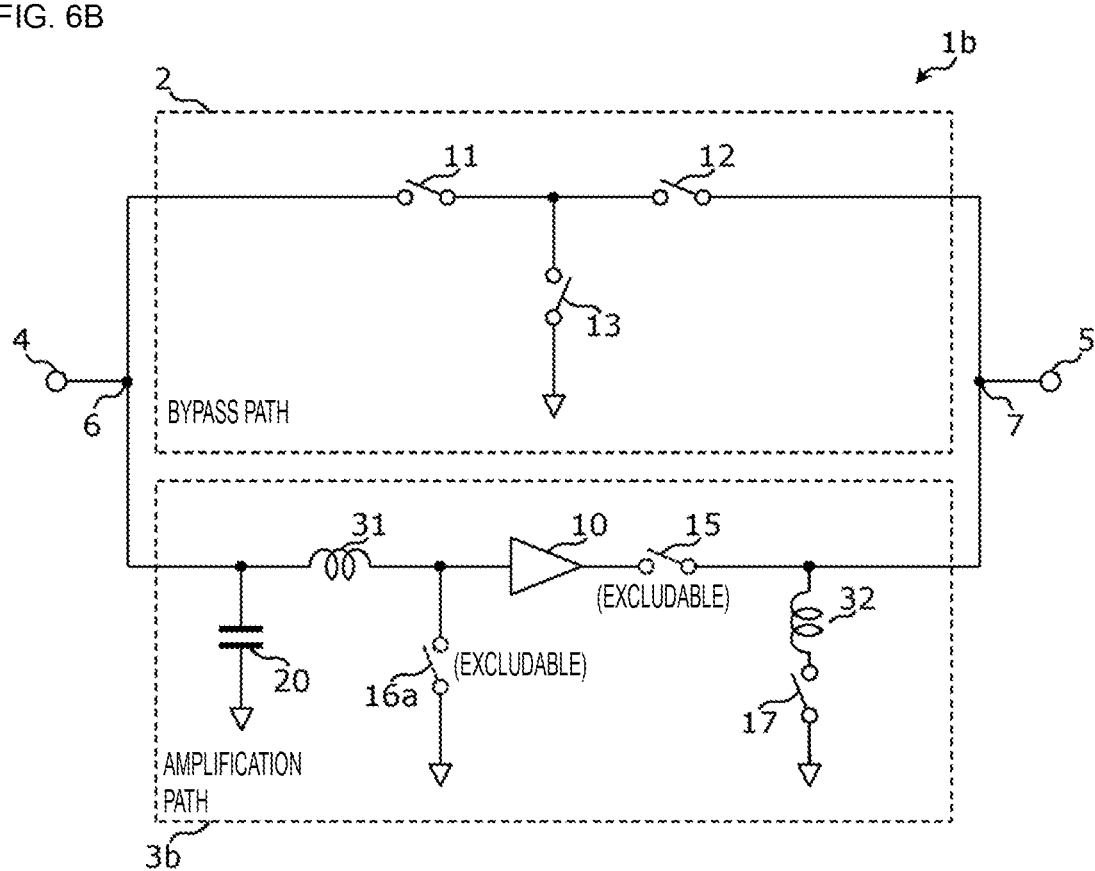
FIG. 6B is a circuit diagram illustrating a further example of a configuration of the amplifier circuit according to the embodiment.

FIG. 6B is a circuit diagram illustrating a further example of a configuration of the amplifier circuit according to the embodiment. An amplifier circuit 1b illustrated in this drawing differs from the amplifier circuit 1 in FIG. 1 in the configuration of an amplification path 3b on the output side with respect to the amplifier 10. Specifically, on the amplification path 3b, the inductor 32 is inserted not in series with a path connecting the amplifier 10 and the output end 5 but in series between the switch 17 and a node on a path connecting the amplifier 10 and the output end 5. In other words, the inductor 32 and the switch 17 are connected in series with each other, and in parallel between ground and a node between the amplifier 10 and the node 7.

Since the inductor 32 is coupled on the output side with respect to the amplifier 10 and the switch 17 coupled between the ground and a first end of the inductor which is opposite to a second end of the inductor at output node's side, the amplifier circuit 1b with the configuration described above also can achieve the same effects as the effects described above with regard to the amplifier circuit 1. Additionally, since in the amplifier circuit 1b the inductor 32 is inserted in series between the switch 17 and the node on the path connecting the amplifier 10 and the output end 5, it is possible to attenuate high frequency signals in a more localized manner in comparison to the case in which the inductor 32 is inserted in series on the path connecting the amplifier 10 and the output end 5.

The amplifier circuits 1, 1a, and 1b can be configured as amplifier modules. In the following description, the amplifier circuits 1, 1a, and 1b configured as amplifier modules are explained.

Figure 7:
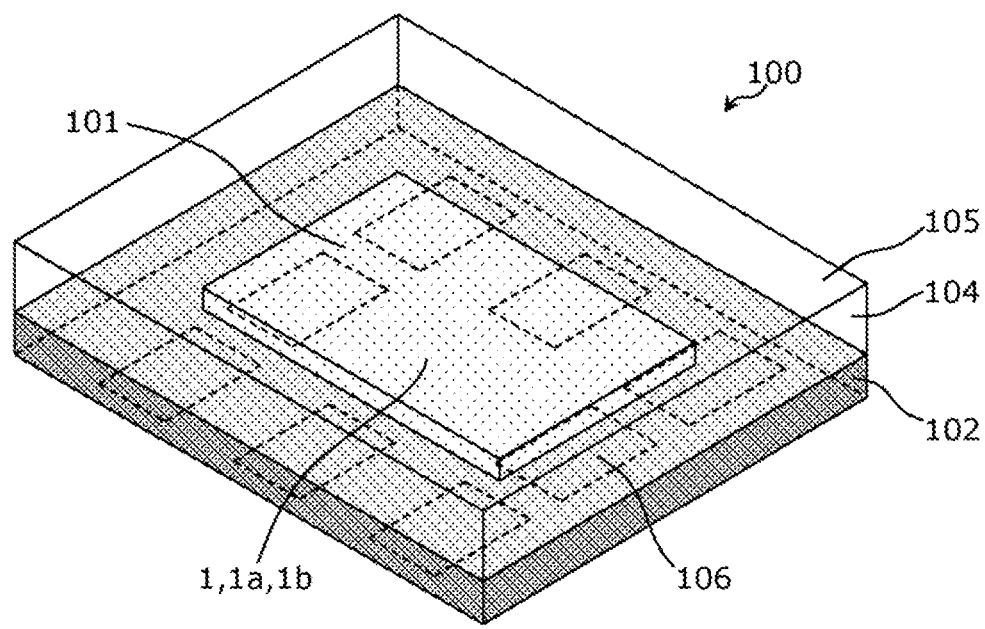
FIG. 7 is a perspective view of an example of a structure of an amplifier module according to the embodiment.

FIG. 7 is a perspective view of an example of a structure of an amplifier module according to the embodiment. An amplifier module 100 includes an IC chip 101 and a module terminal substrate 102.

The amplifier circuit 1, 1a, or 1b is formed at the IC chip 101. For example, spiral inductors are used as the inductors of the amplifier circuits 1, 1a, and 1b and a MOM or MIM capacitor is used as the capacitor of the amplifier circuits 1, 1a, and 1b.

The module terminal substrate 102 is formed of a dielectric material. As the dielectric material, for example, resin materials such as bismaleimide-triazine, epoxy, polyimide, and Teflon (registered trademark), glass cloth, ceramics, or composite materials thereof are utilized.

At the back side of the module terminal substrate 102, a terminal 106 for mounting and signal transmission for a main substrate (not illustrated in the drawing) is provided. The terminal 106 may include an input terminal, an output terminal, a control terminal, a power supply terminal, and a ground terminal.

The IC chip 101 is mounted on one major surface of the module terminal substrate 102 by using, for example, solder bumps. The major surface of the module terminal substrate 102 on which the IC chip 101 is mounted is subjected to transfer molding with an epoxy-type resin 104 to protect the IC chip 101.

The surface of the resin 104 is covered with a metal thin film 105. The metal thin film 105 is formed by employing sputtering, plating, or a combination of these methods with a metallic material. The metal thin film 105 is coupled to a ground electrode at an end surface of the module terminal substrate 102 (not illustrated in the drawing).

While FIG. 7 illustrates the example in which the amplifier circuit 1, 1a, or 1b is configured as the amplifier module 100, the amplifier circuits 1, 1a, and 1b may be configured as ICs. Specifically, the IC chip 101 at which the amplifier circuit 1, 1a, or 1b is formed is configured to not be mounted at the module terminal substrate 102 but function by itself as an amplification IC having a bypass path.

The amplifier circuit of the present disclosure has been described in accordance with the embodiment, but the present disclosure is not limited to the embodiment. Without departing from the scope of the present disclosure, embodiments obtained by making various modifications, which occur to those skilled in the art, on the present embodiment and embodiments constructed by combining the constituent elements in different embodiments with each other may be also embraced in the range of one or more aspects of the present disclosure.

As an amplifier circuit with small non-linear distortion and excellent reduction of insertion loss, the present disclosure can be used for a wide range of wireless hardware devices, such as mobile terminal devices.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An amplifier circuit comprising:
an amplification path that is connected between an input node and an output node, and that comprises an amplifier; and
a bypass path that bypasses at least the amplifier, wherein:
the bypass path comprises:
a first series switch connected in series between the input node and the output node, and
a first shunt switch connected to ground in parallel between the input node and the output node, and
the amplification path further comprises:
an inductor connected to an output side with respect to the amplifier, and
a second shunt switch connected between ground and a first end of the inductor which is opposite to a second end of the inductor at an output node side, wherein the amplifier circuit is configured to operate in:
a bypass mode in which the first series switch is closed, the first shunt switch is open, and the second shunt switch is closed, and
an amplification mode in which the first series switch is open, the first shunt switch is closed, and the second shunt switch is open.

2. The amplifier circuit according to claim 1, wherein:
the amplification path further comprises a second series switch connected in series between the amplifier and the node between the inductor and the amplifier, and
the second series switch is open in the bypass mode and is closed in the amplification mode.

3. The amplifier circuit according to claim 1, wherein:
the bypass path further comprises a third series switch connected in series in the bypass path at a position opposite to the first series switch with respect to a connection position of the first shunt switch, and
the third series switch is closed in the bypass mode and open in the amplification mode.

4. The amplifier circuit according to claim 1, wherein the amplifier comprises a field effect transistor.

5. The amplifier circuit according to claim 1, wherein the first shunt switch comprises a field effect transistor.

6. The amplifier circuit according to claim 1, wherein the amplification path further comprises:
a fourth series switch connected in series between the input node and the amplifier, and
a third shunt switch connected between ground and a node between the fourth series switch and the amplifier.

7. The amplifier circuit according to claim 6, wherein the amplification path further comprises:
a shunt capacitor connected between ground and the node between the fourth series switch and the amplifier, and
a second inductor connected in series between the fourth series switch and the amplifier.

8. The amplifier circuit according to claim 1, wherein the amplification path further comprises:
a second inductor connected in series between the input node and the amplifier, and
a shunt capacitor connected between ground and a node between the input node and the second inductor.

9. The amplifier circuit according to claim 8, wherein the amplification path further comprises:
a third shunt switch connected between ground and a node between the second inductor and amplifier.

10. An amplifier circuit comprising:
an amplification path that is connected between an input node and an output node, and that comprises an amplifier; and
a bypass path that bypasses at least the amplifier, wherein:
the bypass path comprises:
a first series switch connected in series between the input node and the output node, and
a first shunt switch connected to ground in parallel between the input node and the output node, and
the amplification path further comprises:
an inductor and a second shunt switch connected in series with each other, and in parallel between ground and a node between the amplifier and the output node, wherein the amplifier circuit is configured to operate in:
a bypass mode in which the first series switch is closed, the first shunt switch is open, and the second shunt switch is closed, and
an amplification mode in which the first series switch is open, the first shunt switch is closed, and the second shunt switch is open.

11. The amplifier circuit according to claim 10, wherein the amplification path further comprises a second series switch connected in series between the amplifier and the node between the amplifier and the output node.

12. An amplifier circuit comprising:
an amplification path that is connected between an input node and an output node, and that comprises an amplifier; and
a bypass path that bypasses at least the amplifier, wherein:
the bypass path comprises:
a first series switch connected in series between the input node and the output node, and
a first shunt switch connected to ground in parallel between the input node and the output node, and
the amplification path further comprises:
an inductor connected in series between the amplifier and the output node, and
a second shunt switch connected between ground and a node between the inductor and the amplifier, wherein the amplifier circuit is configured to operate in:
a bypass mode in which the first series switch is closed, the first shunt switch is open, and the second shunt switch is closed, and
an amplification mode in which the first series switch is open, the first shunt switch is closed, and the second shunt switch is open.

13. The amplifier circuit according to claim 12, wherein the amplification path further comprises a second series switch connected in series between the amplifier and the node between the amplifier and the output node.

* * * * *